(12) United States Patent
Hasbun

(10) Patent No.: US 11,119,561 B2
(45) Date of Patent: *Sep. 14, 2021

(54) NON-VOLATILE MEMORY SYSTEM OR SUB-SYSTEM

(71) Applicant: Micron Technology, inc., Boise, ID (US)

(72) Inventor: Robert Nasry Hasbun, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/078,832

(22) Filed: Oct. 23, 2020

(65) Prior Publication Data

US 2021/0041935 A1 Feb. 11, 2021

Related U.S. Application Data

(62) Division of application No. 15/630,330, filed on Jun. 22, 2017, now Pat. No. 10,845,866.

(51) Int. Cl.
*G06F 1/3225* (2019.01)
*G06F 1/3234* (2019.01)
(Continued)

(52) U.S. Cl.
CPC .......... *G06F 1/3275* (2013.01); *G06F 1/3225* (2013.01); *G06F 1/3268* (2013.01);
(Continued)

(58) Field of Classification Search
CPC ..................................... G06F 1/3225
(Continued)

(56) References Cited

U.S. PATENT DOCUMENTS 6,775,184 B1    8/2004 Park et al.
7,953,931 B2    5/2011 Yu et al.
(Continued)

OTHER PUBLICATIONS

IPO, "Office Action," issued in connection with ROC (Taiwan) Patent Application No. 107121220, dated Apr. 11, 2019 (8 pages).
(Continued)

*Primary Examiner* — Muna A Techane
(74) *Attorney, Agent, or Firm* — Holland & Hart LLP

(57) ABSTRACT

Systems, devices, and methods related to non-volatile memory are described. A non-volatile memory array may be employed as a main memory array for a system on a chip (SoC) or processor. A controller may interface between the non-volatile memory array and the SoC or processor using a protocol agnostic to characteristics of non-volatile memory operation including different page sizes or access time requirements, etc. A virtual memory bank at the controller may be employed to facilitate operations between the SoC or processor and the non-volatile memory array. The controller may be coupled with a buffer to facilitate rapid data operation, and the controller may be configured to selectively access data at the non-volatile array to account for data stored in the virtual memory bank or the buffer. The controller, the virtual memory bank, and the buffer may be configured on one chip separate from the SoC or processor.

20 Claims, 7 Drawing Sheets

(51) Int. Cl.
*G11C 7/10* (2006.01)
*G11C 11/22* (2006.01)

(52) U.S. Cl.
CPC ............... *G11C 7/10* (2013.01); *G11C 11/22* (2013.01); *G11C 2207/10* (2013.01)

(58) Field of Classification Search
USPC .......................................................... 365/229
See application file for complete search history.

(56) References Cited

U.S. PATENT DOCUMENTS

| | | | |
|---|---|---|---|
| 8,868,829 B2 | 10/2014 | Rajan et al. | |
| 9,268,682 B2* | 2/2016 | Tomlin | G06F 12/0246 |
| 9,823,852 B2 | 11/2017 | Okita | |
| 9,858,198 B2 | 1/2018 | Seiler | |
| 9,971,697 B2 | 5/2018 | Kim et al. | |
| 2002/0042867 A1* | 4/2002 | Henderson | G06F 9/30018 |
| | | | 711/200 |
| 2004/0141374 A1 | 7/2004 | Park et al. | |
| 2008/0046630 A1 | 2/2008 | Lasser | |
| 2008/0209112 A1 | 8/2008 | Yu et al. | |
| 2011/0099325 A1* | 4/2011 | Roh | G06F 3/0679 |
| | | | 711/103 |
| 2011/0307762 A1* | 12/2011 | Tiziani | G06F 12/0246 |
| | | | 714/768 |
| 2012/0151127 A1* | 6/2012 | Lim | G06F 12/0246 |
| | | | 711/103 |
| 2013/0046920 A1* | 2/2013 | Ryu | G06F 12/0246 |
| | | | 711/103 |
| 2015/0138884 A1* | 5/2015 | Park | G06F 13/385 |
| | | | 365/185.08 |
| 2015/0347307 A1 | 12/2015 | Walker | |
| 2016/0342509 A1* | 11/2016 | Kotte | G06F 12/0246 |
| 2017/0147214 A1* | 5/2017 | Ray | G06F 15/781 |

OTHER PUBLICATIONS

European Patent Office, "Extended Search Report," issued in connection with European Patent Application No. 18821215.3, dated Feb. 18, 2021 (10 pages).

Taiwan Intellectual Property Office, "Office Action," issued in connection with ROC (Taiwan) Patent Application No. 109113727, dated Jan. 5, 2021 (9 pages).

Japan Patent Office, "Notice of Rejection Ground," issued in connection with Japanese Patent Application No. 2019-570140, dated Feb. 9, 2021 (6 pages).

ISA/KR, International Search Report and Written Opinion of the International Searching Authority, Int'l. Appl. No. PCT/US2018/037480, Oct. 10, 2018, Korean Intellectual Property Office, Seo-gu, Daejeon, Republic of Korea, 24 pgs.

* cited by examiner

NON-VOLATILE MEMORY SYSTEM OR SUB-SYSTEM

CROSS REFERENCE

The present Application for patent is a divisional of U.S. patent application Ser. No. 15/630,330 by Hasbun, entitled "NON-VOLATILE MEMORY SYSTEM OR SUB-SYSTEM" filed Jun. 22, 2017, assigned to the assignee hereof, and is expressly incorporated by reference in its entirety herein.

BACKGROUND

The following relates generally to memory system and more specifically to non-volatile memory system or sub-system.

Memory system may include various kinds of memory devices and controllers that are coupled via one or more buses to manage information in numerous electronic devices such as computers, wireless communication devices, internet of things, cameras, digital displays, and the like. Memory devices are widely used to store information in such electronic devices. Information is stored by programing different states of a memory cell. For example, binary memory cells have two states, often denoted by a logic "1" or a logic "0." More than two states may be stored in a memory cell.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), 3-dimensional cross-point memory (3D Xpoint), and others. Memory devices may be volatile or non-volatile. Non-volatile memory cells, e.g., FeRAM cells, may maintain their stored logic state for extended periods of time even in the absence of an external power source. Volatile memory cells, e.g., DRAM cells, may lose their stored state over time unless they are periodically refreshed by an external power source. FeRAM may use similar memory device architectures as volatile memory but may have improved performance compared to other non-volatile and volatile memory devices.

Improving memory system, generally, may include increasing memory system performance such as reducing system power consumption, increasing memory system capacity, improving read/write speeds, providing non-volatility by use of persistent main memory, or reducing manufacturing costs at a certain performance point, among other metrics. But improved memory systems often leverage new technology or protocols that are not yet supported by other technologies, or improved memory systems may offer solutions in a broader array of applications if they are backward compatible with earlier technologies.

BRIEF DESCRIPTION OF THE DRAWINGS

The disclosure herein refers to and includes the following figures.

DETAILED DESCRIPTION

Figure 1:
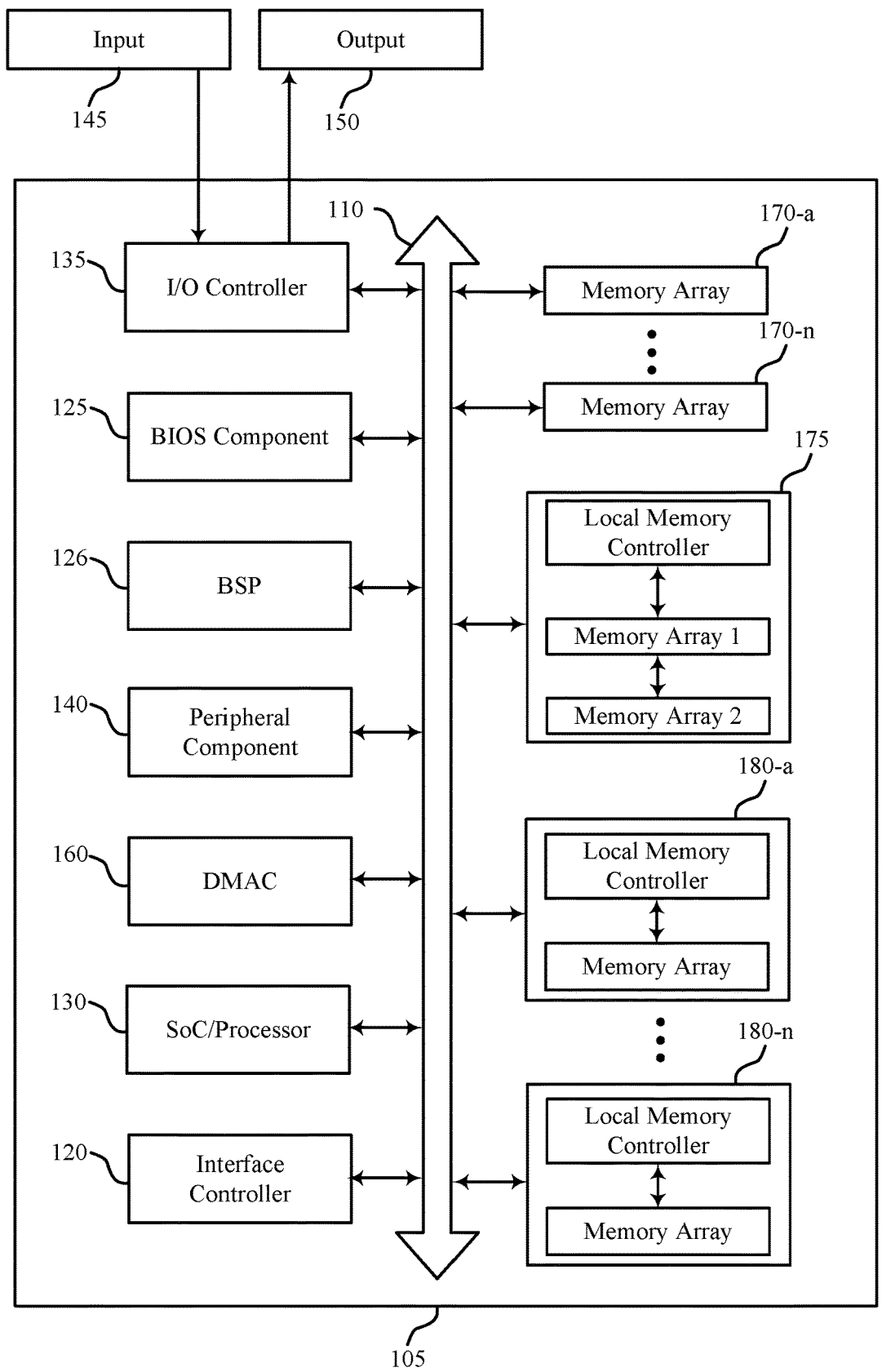
FIG. 1 shows a diagram of a system including a non-volatile memory system or sub-system in accordance with embodiments of the present disclosure.

A non-volatile memory array may be employed as a main memory array for a system on a chip (SoC) or processor. This type of system may provide benefits over those that employ a volatile memory array, including high system performance, high-areal density, and low system power consumption. In order to realize these benefits in a variety of applications, techniques described herein may be employed to provide backward compatibility with SoCs or processors designed for operation with legacy memory system architectures. For example, the present disclosure includes an interface controller in a memory sub-system that may facilitate operation with an SoC or processor using a protocol that is substantially agnostic to characteristics of non-volatile memory operation. The non-volatile memory system or sub-system disclosed herein may also enable desktop applications in mobile environments where power consumption may be an important design factor.

A system as described herein may include an SoC or processor, memory sub-system, and storage. The system may also include a plurality of buses configured to couple various components with one another. A memory sub-system may include a non-volatile memory, a virtual memory bank, and an interface controller. The interface controller may be configured to operate with the SoC/processor via one of the buses. In order to facilitate operation with the SoC/processor using, for example, a DRAM interface via one of the buses, the interface controller may be configured to operate with the non-volatile memory utilizing the virtual memory bank. The virtual memory bank may be built with DRAM cells and configured to operate pursuant to, for example, a low-power, double data rate (LPDDR) specification, which may determine a page size, timing requirements, etc. A page size generally refers to a size of data handled at various interfaces unless particularly specified hereinafter. In addition, the memory sub-system may further include a buffer that could be built as a DRAM buffer. The buffer may be configured to operate with the interface controller and may be configured to be directly accessible by the SoC/processor.

As described in detail below, the interface controller may utilize the virtual memory bank to emulate a DRAM page size, which may facilitate operation with the SoC/processor. For instance, the virtual memory bank may be configured to have a DRAM page size (e.g., a page size specified in a LPDDR specification). In addition, as described herein, the virtual memory bank may be configured to have portions or elements corresponding to a page size of the non-volatile memory. For example, a DRAM page size pursuant to an LPDDR specification may be a superset of a non-volatile memory page size, and the interface controller may allow the system to leverage the benefits of using a different page size in the non-volatile memory array while operating with the SoC/processor configured for use with a DRAM page size. The non-volatile memory may be configured to support variable page sizes.

The interface controller may also allow for low latency or reduced power operation by leveraging the virtual memory bank or the buffer. For example, upon receiving a read command from the SoC/processor, the interface controller may attempt to send data from the virtual memory bank or the buffer to the SoC/processor. If data are not present in the virtual memory bank or buffer, the interface controller may retrieve data from the non-volatile memory and store data in the virtual memory bank while sending the data to the SoC/processor. The interface controller may manage operation of the virtual memory bank according to a protocol described herein. For example, a set of flags may be used to indicate which portions of the virtual memory bank store valid data from the non-volatile memory. Upon receiving a write command from the SoC/processor, the interface controller may store data at virtual memory bank. Another set of flags may indicate when portions of the virtual memory bank store valid data that are different from contents of the non-volatile memory so as to enable interface controller to save only the data that has been modified from the contents in the non-volatile memory.

Furthermore, and as explained in detail below, the interface controller may determine where to store data from the virtual memory bank when the SoC/processor no longer needs the data. The interface controller may monitor and identify contents of the virtual memory bank. Also, the interface controller may have a counter that records a number of access attempts by the SoC/processor to contents of the virtual memory bank during a certain time interval. By way of example, if the counter shows that the number of access attempts by the SoC/processor is less than a pre-determined threshold value, then the interface controller may store modified data in the non-volatile memory anticipating that the SoC/processor may not need to access the data in a short term. The interface controller may discard data after determining that the data has not been modified. Or if the counter indicates that the number of access attempts by the SoC/processor is equal to or larger than the pre-determined threshold value, then the interface controller may store data in the buffer anticipating that the SoC/processor may need to access data soon. One skilled in the art should be able to devise various criteria (e.g., criteria including a value of a counter, a clock, time period, etc.) for the interface controller to make such determination considering overall system requirements. In addition, the counter may set up a by-pass indicator when the number of access attempts by the SoC/processor is less than the pre-determined threshold value in order to by-pass saving the contents of the virtual memory bank to the buffer. The by-pass indicator then may be used to directly save the modified contents of the virtual memory bank to the non-volatile memory.

The foregoing discussion provides an overview of the disclosure. Features and techniques introduced above are further described below in the context of memory system or sub-system architecture and related protocols. Specific examples are then described for a memory system or sub-system in combination with controllers and system buses that support non-volatile memory system or sub-system. These and other features of the disclosure are further illustrated by and described with reference to apparatus diagrams, system diagrams, and flowcharts that relate to non-volatile memory system or sub-system.

FIG. 1 shows a diagram of a system 100 including a non-volatile memory system or sub-system in accordance with embodiments of the present disclosure. System 100 may include a device 105. The device 105 may include an SoC or processor 130, an interface controller 120, and various memory devices 170, 175, and 180. Device 105 may also include input/output controller 135, basic input/output system (BIOS) component 125, board support package (BSP) 126, peripheral component(s) 140, direct memory access controller (DMAC) 160. The components of device 105 may be in electronic communication with one another through bus 110.

Device 105 may be a computing device, electronic device, mobile computing device, or wireless device. Device 105 may be a portable electronic device. Device 105 may be a computer, a laptop computer, a tablet computer, a smartphone, a cellular phone, a wearable device, an internet-connected device, or the like. In some examples, device 105 is configured for bi-directional wireless communication via a base station or access point. In some examples, device 105 is capable of machine-type communication (MTC), machine-to-machine (M2M) communication, or device-to-device (D2D) communication. Device 105 may be referred to as a user equipment (UE), station (STA), mobile terminal, or the like.

SoC/processor 130 may be configured to operate with various memory devices 170, 175, 180, or any combination thereof, either directly or via interface controller 120. In some cases, SoC/processor 130 may perform functions of interface controller 120. SoC/processor 130 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components.

Interface controller 120 may be configured to operate with SoC/processor 130. Interface controller 120 may also be configured to operate with various memory devices 170, 175, 180, or any combination thereof.

Memory devices 170 may each include an array or arrays of memory cells to store digital information. Memory devices 170 may be configured to operate with SoC/processor 130 or interface controller 120. In some examples, memory devices 170 may be configured to serve as a buffer memory for a memory bank for SoC/processor 130 or interface controller 120. In some examples, one or more memory devices 170 may be present in device 105.

Memory device 175 may include a local memory controller configured to operate with an array of memory cells structured in two or more tiers. The local memory controller of memory device 175 may also be configured to operate with SoC/processor 130. The local memory controller of memory device 175 may be configured to handle different characteristics of memory cells to efficiently operate with SoC/processor 130. In some examples, first-tier memory cells may be three-dimensional cross-point (3D Xpoint) memory that may provide a high number of input/output operations per second (IOPS) with a short response time to handle various workloads. In some examples, second-tier memory cells may be three-dimensional Not-AND (NAND) memory that may provide high capacity for data storage at a relatively lower cost than the first-tier memory cells.

Memory device 175 may include other types or combinations of memory arrays in some cases.

Memory devices 180 may include a local memory controller configured to operate with an array or arrays of memory cells. The local memory controller of memory device 180 may also be configured to operate with SoC/processor 130 or interface controller 120. In some examples, memory cells may include non-volatile or volatile memory cells, or a combination of both non-volatile and volatile memory cells. In some examples, the local memory controller of memory device 180 may be configured to handle a variable page size for a memory array where the memory array includes non-volatile memory cells, e.g., ferroelectric memory cells. In some examples, a page size may be fixed at a certain size for a memory array where the memory array includes volatile memory cells, e.g., DRAM cells. In some examples, one or more memory devices 180 may be present in device 105.

DMAC 160 may enable SoC/processor 130 to perform direct memory accesses with memory devices 170, 175, or 180. For example, DMAC 160 may support SoC/processor 130 to directly access a memory device 170, 175, or 180 without the involvement or operation of interface controller 120.

Peripheral component(s) 140 may be any input or output device, or an interface for such devices, that may be integrated into device 105. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots. Peripheral component(s) 140 may be other components understood by those skilled in the art as peripherals.

BIOS component 125 or board support package (BSP) 126 may be a software component that includes a basic input/output system (BIOS) operated as firmware, which may initialize and run various hardware components of system 100. BIOS component 125 or BSP 126 may also manage data flow between SoC/processor 130 and the various components, e.g., peripheral components 140, input/output controller 135, etc. BIOS component 125 or BSP 126 may include a program or software stored in read-only memory (ROM), flash memory, or any other non-volatile memory.

Input/output controller 135 may manage data communication between SoC/processor 130 and peripheral component(s) 140, input devices 145, or output devices 150. Input/output controller 135 may also manage peripherals that are not integrated into device 105. In some cases, input/output controller 135 may represent a physical connection or port to the external peripheral.

Input 145 may represent a device or signal external to device 105 that provides input to device 105 or its components. This may include a user interface or interface with or between other devices. In some cases, input 145 may be a peripheral that interfaces with device 105 via peripheral component(s) 140 or may be managed by input/output controller 135.

Output 150 may represent a device or signal external to device 105 configured to receive output from device 105 or any of its components. Examples of output 150 may include a display, audio speakers, a printing device, or another processor on printed circuit board, etc. In some cases, output 150 may be a peripheral that interfaces with device 105 via peripheral component(s) 140 or may be managed by input/output controller 135.

The components of device 105 may be made up of circuitry designed to carry out their functions. This may include various circuit elements, for example, conductive lines, transistors, capacitors, inductors, resistors, amplifiers, or other active or passive elements, configured to carry out the functions described herein.

In some cases, an apparatus may include an interface controller associated with a first memory array including non-volatile memory cells having a first page size, a system on a chip (SoC) or processor coupled with the interface controller, a second memory array coupled with the first memory array via the interface controller and configured to store data based at least in part on a second page size associated with the SoC or processor, where the second page size is a superset of the first page size, and one or more buses coupled with at least one of the interface controller, the SoC or processor, or the second memory array, or any combination thereof.

In some cases, the apparatus may further include one or more components coupled to the one or more buses, the one or more components including at least one of input and output (I/O) controller, basic input output system (BIOS) component or board support package (BSP), or any combination thereof. In some cases, the apparatus may further include direct memory access controller (DMAC) coupled to the one or more buses, and a third memory array coupled to the interface controller via the one or more buses, where the third memory array includes volatile memory cells. In some cases, the second memory array, the third memory array, and the interface controller are disposed on a same chip. In some cases, the first page size is configurable. In some cases, the apparatus may further include a fourth memory array coupled to the SoC or processor via the one or more buses, where the fourth memory array includes non-volatile memory cells.

Figure 2:
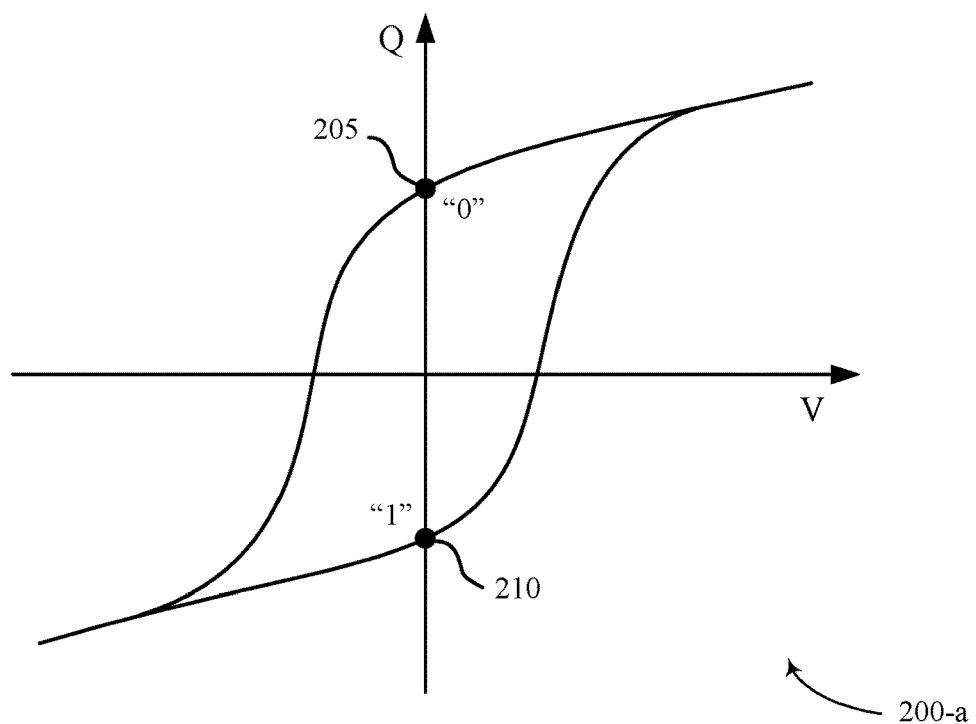
FIG. 2 illustrates an example of non-linear electrical property that support a non-volatile memory system or sub-system in accordance with embodiments of the present disclosure.
Figure 2:
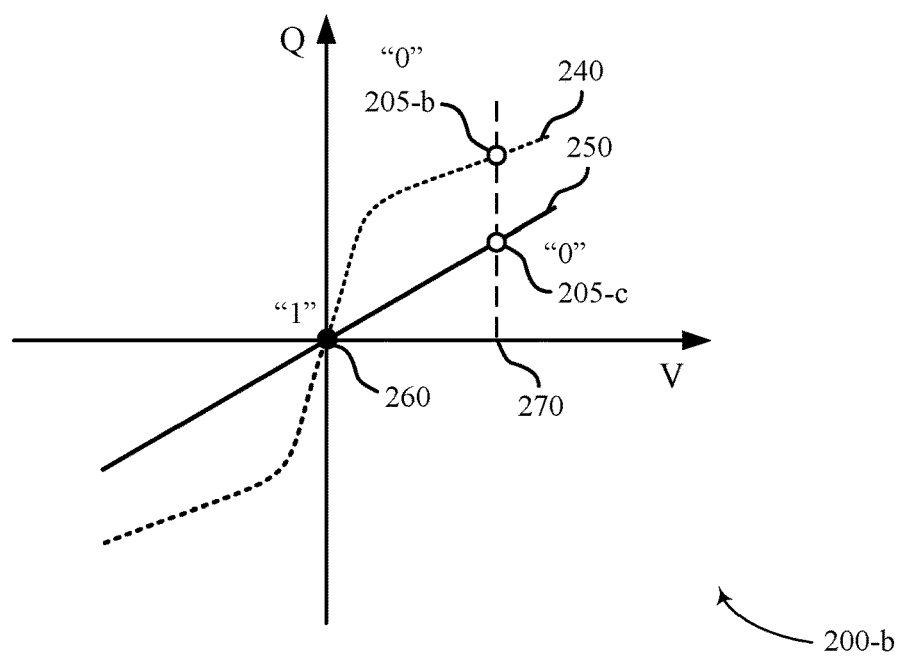

FIG. 2 illustrates an example of non-linear electrical property that support a non-volatile memory system or sub-system in accordance with embodiments of the present disclosure. Plots 200 are provided to illustrate example characteristics that support features and techniques described herein. Other characteristics and material properties may support these features or similar features. Plot 200-a illustrates an example hysteresis curve for a capacitor using a ferroelectric material. Plot 200-b illustrates an example polarization of a capacitor using linear material 250 or a para-electric material 240. Plots 200 depict the charge, Q, stored on a capacitor of a memory cell utilizing ferroelectric, linear, or para-linear materials as a function of a voltage difference across the capacitor, V.

A ferroelectric material is characterized by a spontaneous electric polarization, i.e., it maintains a non-zero electric polarization in the absence of an electric field. In contrast, a linear or para-electric material exhibits polarization only in the presence of an external electric field. Because the electric polarization in a ferroelectric material may be maintained in the absence of an externally applied electric field for a relatively long time, even indefinitely, charge leakage may be significantly decreased as compared with, for example, para-electric capacitors employed in DRAM arrays. Therefore, ferroelectric memory cells may reduce or eliminate requirements to perform refresh operations when compared to DRAM cells.

As depicted in plot 200-a, the ferroelectric material may maintain a positive or negative charge with a zero voltage difference, resulting in two possible charged states: charge state 205 and charge state 210. According to the example of FIG. 2, charge state 205 represents a logic 0 and charge state 210 represents a logic 1. In some examples, the logic values of the respective charge states may be reversed. Charge states 205 and 210 may also be referred to as the remnant polarization (Pr) values, i.e., the remaining polarization (and thus the charge) upon removing the external bias (e.g., voltage). The ferroelectric discussed herein may be a compound that includes hafnium, zirconium, or oxygen, or any combination thereof. For example, it may include hafnium oxide or zirconia. Because the memory cells utilizing ferroelectric material maintain stored charges in the absence of external bias/voltage, ferroelectric memory cells may be termed "non-volatile memory."

Plot 200-b illustrates example polarization curves for a linear material 250 and a para-electric material 240. As shown, the charge, Q, of linear material 250 is linear with the applied voltage, V. Para-electric material 240 exhibits a non-linear charge with voltage. As compared with a ferroelectric material shown in polarization plot 200-a, however, both linear material 250 and para-electric material 240 have a zero charge at zero voltage. Different logic states may be stored by applying a non-zero voltage to a capacitor utilizing linear material 250 or para-electric material 240. For example, charge state 205-b and 205-c corresponding to a positive voltage 270 may represent a logic 0 for para-electric material 240 and linear material 250, respectively. Negative voltages may be used as well. A charge of zero (charge state 260) may represent a logic 1 for linear material 250 and para-electric material 240. Because the linear or para-linear capacitor has a non-zero voltage across the capacitor when charged, it may be energetically favorable for electrons to leak away from the capacitor. Thus, the stored charge may leak until the charge stored in the linear or para-linear capacitor reaches to a level no longer considered as logic 0 and the stored logic state becomes corrupted or lost. Accordingly, memory cells utilizing either linear material 250 or para-electric material 240 may be termed "volatile memory."

Both non-volatile and volatile memory may have beneficial characteristics or may be employed to support or implement the techniques described herein.

Figure 3:
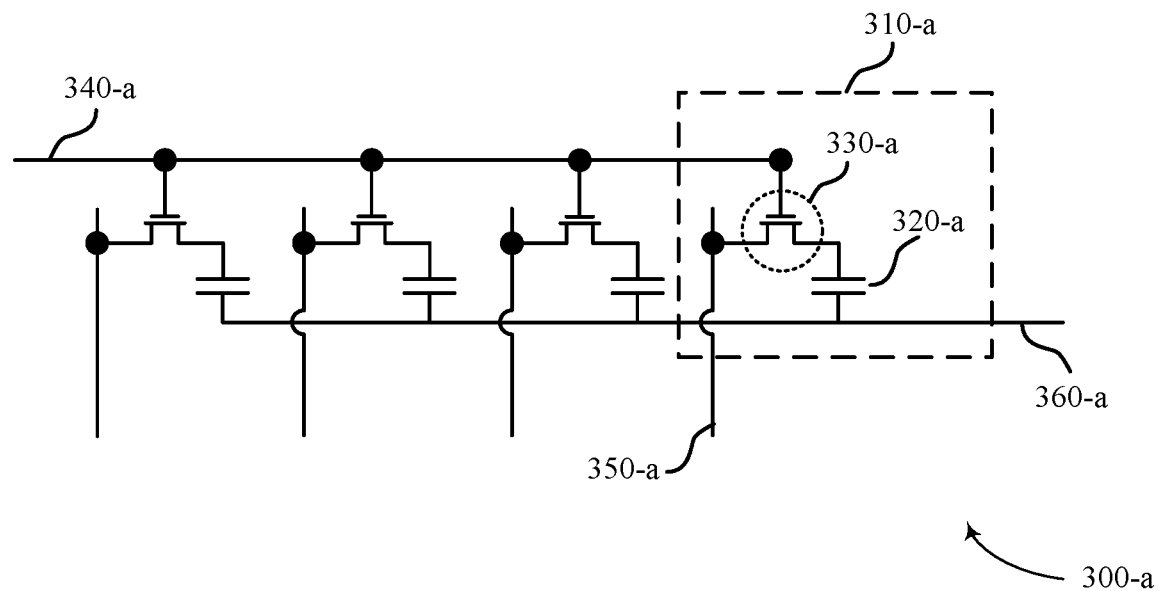
FIG. 3 illustrates an example of circuits that support a non-volatile memory system or sub-system in accordance with embodiments of the present disclosure.
Figure 3:
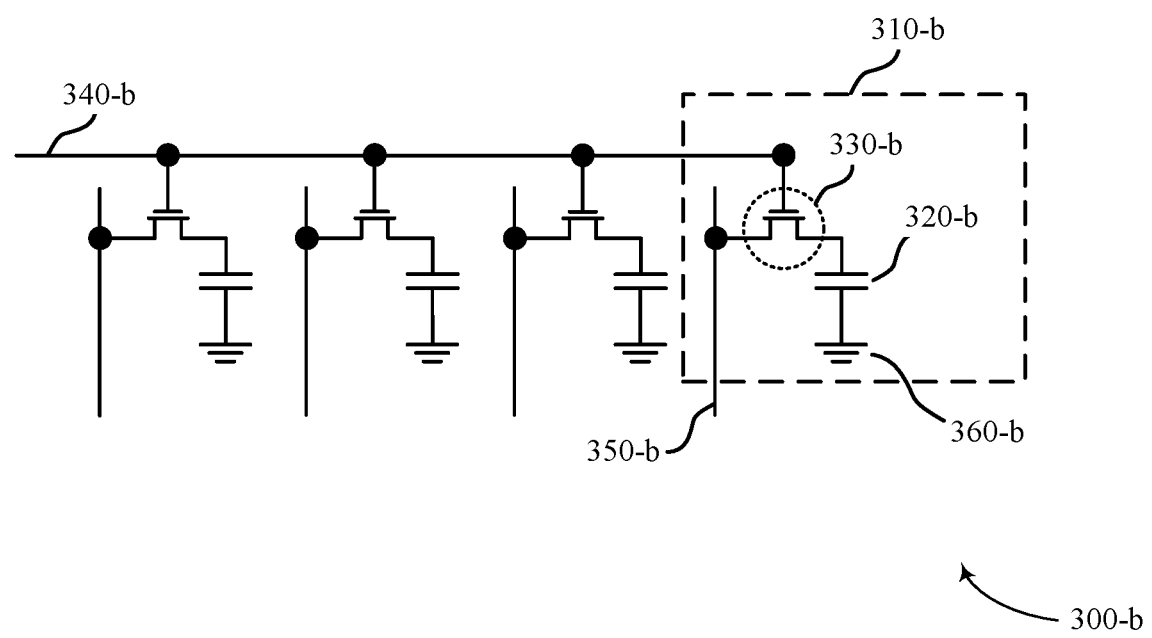

FIG. 3 illustrates examples of circuits that support a non-volatile memory system or sub-system in accordance with embodiments of the present disclosure. Circuits 300 are provided to illustrate example characteristics that support features and techniques described herein. Other circuit configurations may support these features or similar features. Circuit 300-a may represent a row of ferroelectric memory array having ferroelectric memory cells that support a non-volatile memory system or sub-system. Circuit 300-b may represent a row of volatile memory array having a linear/para-linear electric memory cells of a legacy DRAM array. The circuits 300 may illustrate aspects or portions of the arrays described with reference to FIG. 1.

Circuit 300-a may include a row of ferroelectric memory cells 310-a, a word line 340-a, bit lines 350-a, and a plate line 360-a. Each ferroelectric memory cell 310-a may include a selection component 330-a and a ferroelectric capacitor 320-a. In some examples, selection component 330-a may be a field-effect transistor (FET). Memory cell 310-a having a ferroelectric capacitor may be referred to as a FeRAM cell. It should be appreciated by a person of ordinary skill that a two-dimensional array of ferroelectric memory cells may be arranged by repeating multiple rows of circuit 300-a with extended bit lines 350-a common to the multiple rows of memory cells.

Circuit 300-b may include a row of linear/para-linear memory cells 310-b, a word line 340-b, and bit lines 350-b. Each linear/para-linear memory cell may include a selection component 330-b and a linear/para-linear capacitor 320-b. In some examples, selection component 330-b may be a field-effect transistor (FET). Memory cell 310-b having a linear/para-linear capacitor may be referred to as a DRAM cell. A terminal of the linear/para-linear capacitor is connected to ground or virtual ground. It should be appreciated by a person of ordinary skill that a two-dimensional array of linear/para-linear memory cells may be arranged by repeating multiple rows of circuit 300-b with extended bit lines 350-b common to the multiple rows of memory cells.

During memory access operation a row of memory cells may be activated by activating a word line associated with the row. When a row of DRAM cells in circuit 300-b is activated, each selection component 330-b is activated connecting a terminal of DRAM capacitor 320-b to a digit line 350-b while the other terminal of DRAM capacitor 320-b is grounded or virtually grounded. Consequently, charges stored in DRAM capacitor 320-b, will "flow" and such flow or lack thereof (i.e., when there is no charge stored in DRAM capacitor 320-b) must be detected by each digit line 350-b. Therefore, each of the DRAM cells connected to a word line need to be sensed when the word line is activated. DRAM page size may be determined based at least in part on this nature of DRAM operation. In order to avoid unreasonable overhead associated with repeating digital logic circuitry performing sensing, latching, and controlling of relatively small chunks of data, a typical DRAM page size tends to be fairly large. For example, a typical DRAM page size may be 2048 bytes.

On the contrary, when a row of FeRAM cells in circuit 300-a is activated, each selection component 330-a is activated connecting a terminal of ferroelectric capacitor 320-a to a digit line 350-a while the other terminal of ferroelectric capacitor 320-a is connected to plate line 360-a. Plate line 360-a in conjunction with the nature of ferroelectric material between the plates of capacitor 320-a may prevent capacitor 320-a from discharging upon connection to digit line 350-a. Operation of FeRAM cell 310-a by varying the voltage to plate line 360-a may be referred to as "moving cell plate." Therefore, a subset of the FeRAM cells connected to a word line 340-a may be sensed at a time without having to sense all the FeRAM cells connected to the word line 340-a. Such nature of FeRAM cell operation may be utilized to provide a smaller page size for FeRAM than a typical DRAM page size. For example, a typical FeRAM page size may be 64 bytes. Smaller page-size may allow efficient operation of FeRAM cells that usually requires higher power than operation of DRAM cells. Smaller page-size may facilitate effective energy usage during operation of FeRAM device because only a small portion of FeRAM array may need to be activated when associated change in information is small. Furthermore, page-size for array of FeRAM cells may be varied depending on nature of data and command utilizing FeRAM operation.

In some memory device architectures, including DRAM, memory cells may lose their stored state over time unless they are periodically refreshed by an external power source. For example, a charged capacitor with linear/para-linear materials may become discharged over time through leakage currents, resulting in the loss of the stored information. The refresh rate of these volatile memory devices may be relatively high, e.g., tens of refresh operations per second for DRAM arrays, which may result in significant system power consumption. With increasingly larger memory arrays, increased power consumption may inhibit the deployment or operation of memory arrays (e.g., power supplies, heat generation, material limits, etc.) within a memory system or sub-system, especially for mobile devices that rely on a finite power source, such as a battery.

As discussed above, ferroelectric memory devices may provide benefit due to their energy efficient variable page-size operations and non-volatile nature of the ferroelectric capacitors such as near-zero standby power due to the lack of refresh operation, which may increase the battery life and allow for features such as instant-on operation following a standby or un-powered (e.g., "off") state or higher areal memory density with low system power consumption. Such features of non-volatile memory system or sub-system may, for example, enable running desktop application in mobile environments.

Figure 4:
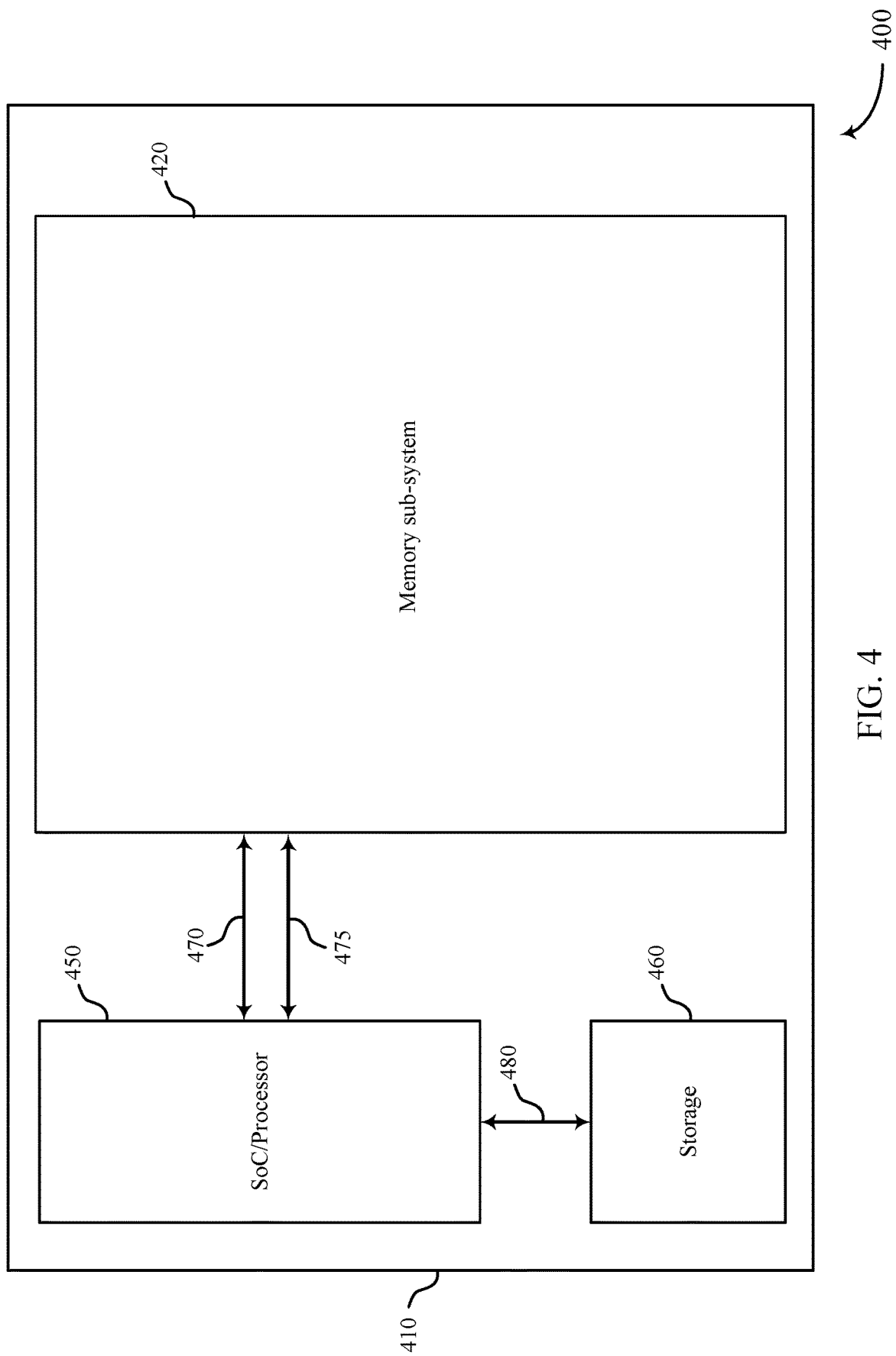
FIG. 4 illustrates an exemplary non-volatile memory system or sub-system in accordance with embodiments of the present disclosure.

FIG. 4 illustrates an exemplary system 400 that supports non-volatile memory system or sub-system in accordance with embodiments of the present disclosure. System 400 may be an example of system 100 as described with reference to FIG. 1 and may include a device 410. Device 410 may be an example of device 105 as described with reference to FIG. 1. Device 410 may include SoC/processor 450, memory sub-system 420, and storage 460. SoC/processor 450 may be an example of SoC/processor 130 as described with reference to FIG. 1.

Memory sub-system 420 may be an example of memory device 180 as described with reference to FIG. 1. Storage 460 may be an example of memory device 175 as described with reference to FIG. 1. SoC/processor 450 may be configured to operate with storage 460 via a bus 480 and memory sub-system 420 via buses 470 and 475. In some examples, bus 480 may be configured support periphery component interconnect express (PCIe), bus 470 low power double data rate (LPDDR) command and address (CA), and bus 475 LPDDR input/output (I/O). In some examples, memory sub-system 420 may be one or more of DRAM arrays. As discussed above, DRAM cells may lose their stored state over time unless they are periodically refreshed by an external power source. The refresh rate of DRAM devices may be relatively high, which may result in higher power consumption relative to other memory technologies. With increasingly larger DRAM memory arrays, increased power consumption may inhibit the deployment or operation of DRAM memory arrays (e.g., power supplies, heat generation, material limits, etc.) in memory sub-system 420, especially for mobile devices that rely on a finite power source, such as a battery.

In some examples, memory sub-system 420 may be one or more of FeRAM arrays. In other examples, memory sub-system 420 may be other kinds of non-volatile memory devices employing different non-volatile memory technologies than FeRAM. As discussed above, FeRAM arrays may provide benefits over DRAM arrays due to non-volatile nature of ferroelectric capacitors, especially in mobile system where battery power consumption may be one of primary factors to consider. Moreover, non-volatile nature of FeRAM may provide additional benefits in dealing with time of power-interruption so as not to lose data residing in volatile DRAM arrays. However, memory sub-system including FeRAM arrays may affect other aspects of system operation or design and integration of buses 470 and 475 because FeRAM may present different characteristics when compared to DRAM arrays, such as latencies involved in data access, page-size, etc. In addition, being able to provide an alternative solution capable of communicating with legacy components or using legacy protocols, such as via buses 470 and 475, may increase the number of applications that can benefit from FeRAM technology.

Figure 5:
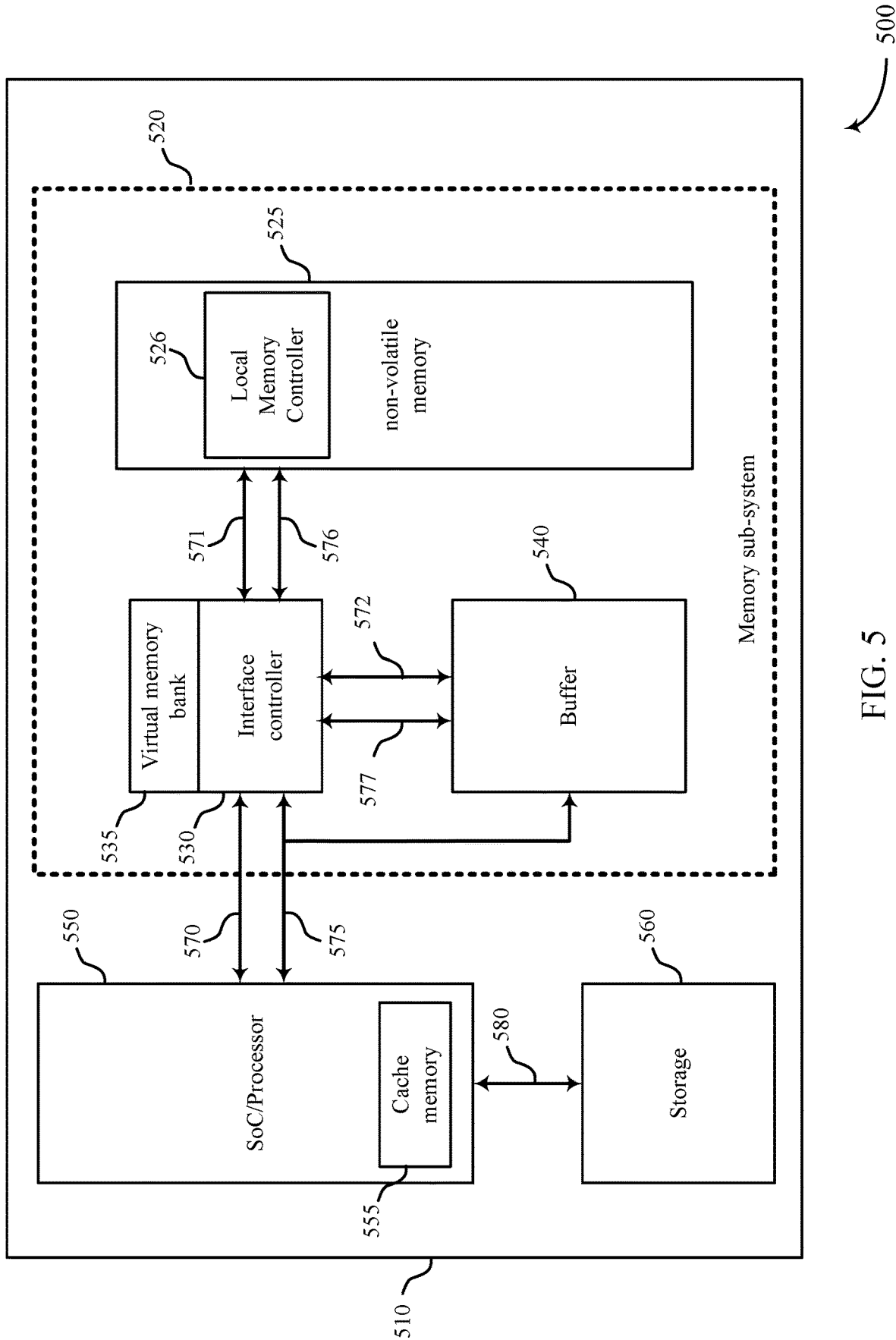
FIG. 5 illustrates an exemplary memory system that supports a non-volatile memory system or sub-system in accordance with embodiments of the present disclosure.

FIG. 5 illustrates an exemplary system that supports a non-volatile memory system or sub-system in accordance with embodiments of the present disclosure. System 500 may be an example of system 400 as described with reference to FIG. 4 and may include a device 510. Device 510 may be an example of device 410 as described with reference to FIG. 4. Device 510 may include SoC/processor 550, memory sub-system 520, and storage 560. SoC/processor 550 may be an example of SoC/processor 450 as described with reference to FIG. 4. Memory sub-system 520 may be an example of memory sub-system 420 as described with reference to FIG. 4. Storage 560 may be an example of storage 460 as described with reference to FIG. 4. Bus 580 may be an example of bus 480 as described with reference to FIG. 4 and SoC/processor 550 may be configured to operate with storage 560 via bus 580. Bus 570 may be an example of bus 470 as described with reference to FIG. 4. Bus 575 may be an example of bus 475 as described with reference to FIG. 4. SoC/processor 550 may be configured to operate with memory sub-system 520 via buses 570 and 575. In some examples, SoC/processor 550 may be configured to have local memory array dispositioned on a same substrate to function as cache memory 555.

Memory sub-system 520 may include non-volatile memory 525, virtual memory bank 535, and interface controller 530. Non-volatile memory 525 may be an example of memory device 180 as described with reference to FIG. 1. Virtual memory bank 535 may be an example of memory device 170 as described with reference to FIG. 1. Interface controller 530 may be an example of interface controller 120 as described with reference to FIG. 1.

Interface controller 530 may be configured to operate with SoC/processor 550 via buses 570 and 575. Buses 570 and 575 may be examples of buses 470 and 475 as described with reference to FIG. 4, respectively. In some examples, virtual memory bank 535 may be built with DRAM cells and configured to operate pursuant to LPDDR specification; for example, page size, timing requirements, etc., may be based on an LPDDR specification so that virtual memory bank 535 may facilitate operations with legacy components or using legacy protocols, such as via buses 570 and 575. In addition, interface controller 530 may be configured to operate with non-volatile memory 525 via buses 571 and 576. In some examples, interface controller 530 may include virtual memory bank 535. Interface controller 530 collaborating with virtual memory bank 535 may be configured to operate with SoP/processor 550 pursuant to LPDDR specification, e.g., page size, timing requirements, etc.

In some examples, memory sub-system 520 may further include buffer 540. In some examples, buffer 540 may be built as a DRAM buffer. Buffer 540 may be an example of memory device 170 or 180 as described with reference to FIG. 1. In addition, interface controller 530 may be configured to operate with buffer 540 via buses 572 and 577. In some examples, bus 572 may be buffer CA bus. In some examples, bus 577 may be interface (IF) buffer I/O bus. Interface controller 530 and buses 572 and 577 may be configured to be compatible with protocols involving DRAM, such as LPDDR page-sizes and timings. In some examples, SoC/processor 550 may be configured to directly operate with buffer 540 via bus 575. In some examples, buffer 540 may be configured to have a page size compatible with bus 575 and hence directly accessible by SoC/processor 550.

Buffer 540 present in memory system domain may be configured to operate as an augmentation of cache memory 555 within SoC/processor 550. In some examples, capacity of buffer 540 may be in the order of 256 M bytes. In some examples, capacity of buffer 540 may be determined based at least in part on size of cache memory 555 in SoC/processor 550. Relatively small capacity of buffer 540 may provide opportunity for memory sub-system 520 to perform better than a typical DRAM of larger capacity because of potentially smaller parasitic components, e.g., inductance associated with metal lines. Smaller capacity of buffer 540 may provide additional benefit in terms of reducing system power consumption associated with periodic refreshing operation.

Memory sub-system 520 may be implemented in various configurations, including a one-chip version and a multi-chip version. One-chip version may include interface controller 530, virtual memory bank 535, and non-volatile memory 525 on a single chip. In some examples, buffer 540 may be included in the single-chip. In contrast, a multi-chip version may have each one of constituents in memory sub-system 520, namely interface controller 530, virtual memory bank 535, non-volatile memory 525, and buffer 540 in a single chip separately. A variation of a multi-chip version may include a chip having both virtual memory bank 535 and interface controller 530. Also, a multi-chip version may further include buffer 540 implemented on a separate chip. A variation may have buffer 540 to include virtual memory bank 535. In yet another example, a multi-chip version may include non-volatile memory and buffer on a same chip. In some examples, non-volatile memory array may include array of DRAM cells. In some cases, interface controller 530, virtual memory bank 535, and buffer 540 may be disposed on a same chip.

In some examples, non-volatile memory 525 may be an array of FeRAM with local memory controller 526. In some examples, non-volatile memory 525 may be referred to as non-volatile near memory to SoC/processor 550 in comparison to storage 560. Non-volatile memory 525 as near memory may, for example, limit or avoid overhead that may be associated with retrieving data from storage 560.

In some examples, capacity of non-volatile memory 525 may be in the order of 32 G bytes. Non-volatile memory 525 may save critical information upon unexpected power interruption instead of accessing storage 560, where accessing storage 560 may be associated with undesired delay. Local memory controller 526 of non-volatile memory 525 may be configured to determine variable page size for non-volatile memory 525. In some examples, page-size of FeRAM may be smaller than a page size of LPDDR DRAM and the page size of LPDDR DRAM may be a superset of the page-size of FeRAM. An example of LPDDR DRAM page size may be 2048 bytes and an example of FeRAM page-size may be 64 bytes. Interface controller 530 may be configured to operate with non-volatile memory 525 via buses 571 and 576. In some examples, bus 571 may be FeRAM CA bus. In some examples, bus 576 may be FeRAM interface (IF) bus. Interface controller 530 and buses 572 and 576 may be configured to be compatible with the page-size of non-volatile memory 525.

In some cases, an apparatus may include a first memory array that includes non-volatile memory cells having a first page size, a first controller coupled with the first memory array and configured to interface with a system on a chip (SoC) or processor; and a second memory array coupled with the first memory array via the first controller and configured to store data based at least in part on a second page size associated with the SoC or processor, where the second page size is a superset of the first page size. In some cases, the apparatus may further include a third memory array coupled with the first controller, where the third memory array is configured at least in part with the second page size. In some cases, the second memory array, the third memory array, and the first controller are disposed on a same chip. In some cases, the first page size is configurable.

In some cases, the third memory array is coupled to the SoC or processor. In some cases, the third memory array overlies the SoC or processor. In some cases, the third memory array includes volatile memory cells. In some cases, the first memory array and the third memory array are disposed on a first chip. In some cases, the first memory array includes the third memory array. In some cases, the first memory array, the first controller, and the second memory array are disposed on a first chip. In some cases, the apparatus may further include the SoC or processor, where the SoC or processor is coupled with the first memory array via the first controller, and where the SoC or processor is disposed on a second chip that is separate from the first chip. In some cases, the apparatus may further include an additional memory array that includes non-volatile memory cells coupled with the SoC or processor. In some cases, the additional memory array includes a first group of non-volatile memory cells coupled with the SoC or processor and a second group of non-volatile memory cells coupled with the SoC or processor via the first group of non-volatile memory cells.

In some cases, the SoC or processor includes a local memory array configured as cache memory at the SoC or processor. In some cases, the apparatus may further include a second controller coupled with and disposed on a same chip as the first memory array, where the second controller is configured to determine the first page size for the first memory array. In some cases, the second memory array is configured to store data according to the first page size of the first memory array. In some cases, the second memory array is configured to store a first flag indicating one or more portions of the second memory array storing valid data from the first memory array. In some cases, the second memory array is configured to store a second flag indicating one or more portions of the second memory array storing data that is different from the first memory array. In some cases, the first controller includes the second memory array, and where the first controller and the second memory array are disposed on a same chip.

In some cases, an apparatus may include a first memory array that includes non-volatile memory cells having a first page size; a local controller coupled with the first memory array and configured to interface with a system on a chip (SoC) or processor; a second memory array coupled with the local controller and configured to store data based at least in part on a second page size that is a superset of the first page size; and a third memory array coupled with the local controller and configured to store data at least in part according to the second page size. In some cases, the second memory array, the third memory array, and the local controller are disposed on a same chip. In some cases, the first page size is configurable. In some cases, the second page size is associated with the SoC or processor. In some cases, the third memory array is coupled to the SoC or processor.

In some cases, an apparatus may include a first memory array that includes non-volatile memory cells having a first page size, a second memory array that is configured to store data based at least in part on a second page size associated with a system on chip (SoC) or processor, where the second page size is a superset of the first page size, a third memory array including volatile memory cells configured at least in part with the second page size, and a controller configured to interface with the SoC or processor, the first memory array, the second memory array, and the third memory array, where the controller is operable to: receive, from the SoC or processor, a memory operation command for accessing the first memory array, determine whether data associated with the memory operation command is stored at the second memory array, where the determination is based at least in part on one or more flags stored at the second memory array; and execute the memory operation command at the first memory array or the second memory array based at least in part on the determination whether the data associated with the memory operation command is stored at the second memory array.

In some cases, the second memory array, the third memory array, and the interface controller are disposed on a same chip. In some cases, the first page size is configurable. In some cases, the controller is operable to detect one or more first flags that each indicate a portion of the second memory array storing valid data from the first memory array; or detect one or more second flags that each indicate a portion of the second memory array storing data that is different from the first memory array; or detect one or more of the first flags and one or more of the second flags. In some cases, the memory operation command includes a read command. In some cases, the controller is operable to determine that data associated with the memory operation command is stored at the third memory array, where the third memory array is configured at least in part with the second page size; where the controller is further operable to fetch data from the third memory array based at least in part on determining that data associated with the memory operation command is stored at the third memory array; and send data to the SoC or processor based at least in part on fetching the data.

In some cases, the controller is operable to determine that data associated with the memory operation command is stored at the third memory array, where the third memory array is configured at least in part with the second page size; and cause the SoC or processor to access the third memory array directly. In some cases, the first controller is operable to fetch data from the second memory array based at least in part on determining that data associated with the memory operation command is stored at the second memory array; and send the data to the SoC or processor based at least in part on fetching the data. In some cases, the first controller is operable to fetch data from the first memory array based at least in part on determining whether data associated with the memory operation command is stored at the second memory array, store data in one or more portions of the second memory array, update the one or more first flags indicating valid data stored in the one or more portions of the second memory array; and send the data to the SoC or processor based at least in part on fetching the data.

In some cases, the memory operation command includes a write command. In some cases, the first controller is operable to store data in one or more portions of the second memory array; and update the one or more second flags indicating portions of the second memory array storing data that is different from the first memory array. In some cases, the memory operation command from the SoC or processor includes a command to write data from the second memory array to either the first memory array or to the third memory array based at least in part on a number of access attempts by the SoC or processor during a time interval. In some cases, the first controller is operable to store data at the first memory array based at least in part on the number of access attempts being less than a threshold value. In some cases, the threshold value includes at least one of a temporal value, a value of a counter, a clock, or any combination thereof. In some cases, the first controller is operable to store data at the third memory array based at least in part on the number of access attempts being equal to or greater than a threshold value. In some cases, the threshold value includes at least one of a temporal value, a value of a counter, a clock, or any combination thereof.

Figure 6:
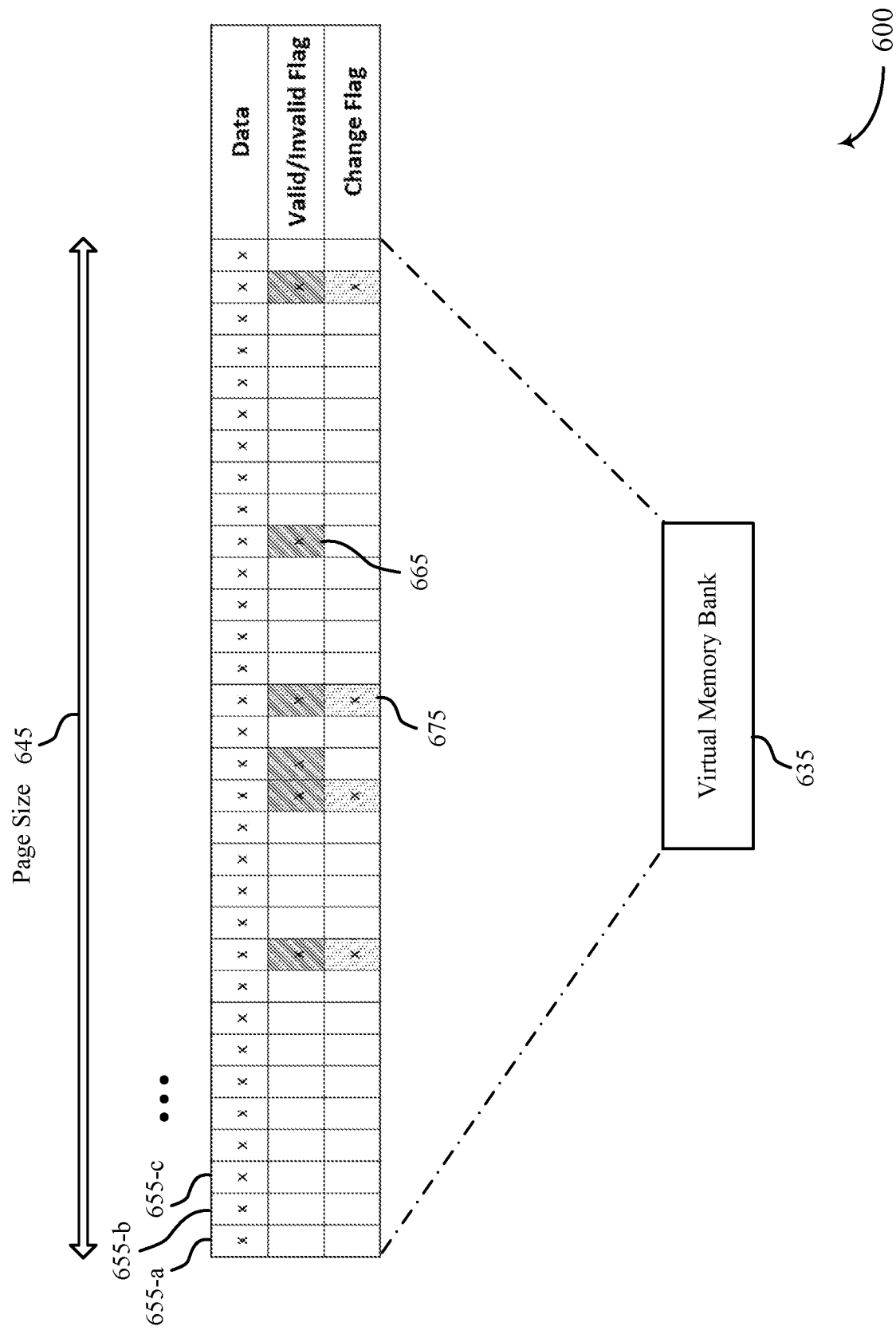
FIG. 6 illustrates an exemplary schematic diagram of a protocol that supports a non-volatile memory system or sub-system in accordance with embodiments of the present disclosure.

FIG. 6 illustrates an exemplary schematic diagram of a protocol that supports a non-volatile memory system or sub-system in accordance with embodiments of the present disclosure. FIG. 6 shows virtual memory bank 635 and an aspect of details thereof, in conjunction with various components shown in FIG. 5. Virtual memory bank 635 may be an example of virtual memory bank 535 as described with reference to FIG. 5. As illustrated above, virtual memory bank 635 may be disposed on a same chip as interface controller 530. Virtual memory bank 635 may be configured to have a plurality of portions 655 where each portion 655-*a*, 655-*b*, and 655-*c*, etc. may correspond to a page-size of non-volatile memory 525. The example of FIG. 6 is described with reference to operations of components depicted in FIG. 5.

A concatenated series of the portions 655 may be configured to represent a page size 645 compatible to operate with SoC/processor 550 via buses 570 and 575. In some examples, each portion 655 may represent 64 bytes and page size 645 may represent 2048 bytes. In such cases, concatenation of thirty-two portions of 655 would build a set of data having a page-size of 2048 bytes that corresponds to page size 645 so that interface controller 530 may operate with SoC/processor 550 via buses 570 and 575. Thus, virtual memory bank 635 that operates together with interface controller 530 may segue between SoC/processor 550 and non-volatile memory 525 in a manner that is compatible with buses 570 and 575.

The example of FIG. 6 shows one page of memory representing a unit of data compatible to operate with SoC/processor 550 for the purpose of simplifying illustration. It should be appreciated by one skilled in the art that virtual memory bank 635 may be configured to have plurality of such unit of data in order to optimize performance of memory sub-system 520 depending on kinds of applications memory sub-system to support, capacity of non-volatile memory 525, and capacity of buffer 540, etc. In some examples, virtual memory bank 635 may be configured with eight unit of data.

In some examples, interface controller 530 may receive a memory operation command from SoC/processor 550 via bus 570. The memory operation command may be a read command. Subsequently, interface controller 530 may determine whether data associated with the read command are present in one or more of the portions 655 of virtual memory bank 635. In determining whether data are present in one or more of the portions 655 of virtual memory bank 635, interface controller 530 may detect valid/invalid flags 665 indicating valid data stored in one or more portions 655 of virtual memory bank 635. If the data are present in one or more of portions 655 of virtual memory bank 635, then interface controller 530 may retrieve data from virtual memory bank 635 and send the data to SoC/processor 550 via 575. This operation may be accomplished compatible with LPDDR specification and SoC/processor 550 may operate accordingly because the data are already present in virtual memory bank 635 and page size 645 is compatible with LPDDR specification. So interface controller 530 may not have to access non-volatile memory 525.

In contrast, when the data are not present in one or more portions 655 of virtual memory bank 635, interface controller 530 may access non-volatile memory 525 and store the data in one or more portions 655 of virtual memory bank 635 while also sending the data to SoC/processor 550. Interface controller 530 may update valid/invalid flags 665 indicating valid data stored in one or more portions 655 of virtual memory bank 635 so as to enable future use of the valid data by detecting valid/invalid flags 665. This operation may incur an additional delay time that may be incompatible with LPDDR specification due to the fact that interface controller 530 retrieves data from non-volatile memory 525. Consequently, SoC/processor 550 may be informed to expect a longer delay than LPDDR specification to have the data available for SoC/processor 550 via bus 575.

In some examples, interface controller 530 may determine data associated with the read command is stored at buffer 540. Subsequently, interface controller 530 may retrieve data from buffer 540 and send the data to SoC/processor 550 via bus 575. In some cases, SoC/processor 550 may directly access buffer 540. Because buffer 540 may be configured to operate with buses 570 and 575, this operation may be compatible with LPDDR specification and SoC/processor 550 may operate accordingly.

In other examples, interface controller 530 may receive a memory operation command from SoC/processor 550 via bus 570. The memory operation command may be a write command. Subsequently, interface controller 530 stores data in one or more portion of virtual memory bank upon receiving the data from SoC/processor 550 via bus 575. Then, interface controller 530 may determine that data stored in one or more portions 655 of virtual memory bank 635 may be different from the data from the non-volatile memory 525. Consequently, interface controller 530 may update change flags 675 that each indicates a portion 655 of the virtual memory bank 635 having data different from the data stored in the non-volatile memory 525. Change flags 675 may serve to indicate to interface controller 530 in which portions 655 of the data in virtual memory bank 635 to store back to non-volatile memory 525. This may allow interface controller 530 to store the data contents changed by SoC/processor 550 without expending resources to store same data that are already present in non-volatile memory 525. It should be appreciated that a write command from SoC/processor 550 write to virtual memory bank 635 without non-volatile memory 525 involved and therefore may be accomplished according to LPDDR specification and SoC/processor 550 may operate accordingly.

In some examples, interface controller 530 may receive a memory operation command from SoC/processor 550. The memory operation command may be associated with closing a page of data in virtual memory bank 635 and therefore interface controller 530 may determine where to store the page of data prior to the closing. Interface controller 530 may be configured to monitor and identify contents of virtual memory bank 635. Interface controller 530 may be configured to have a counter that records a number of access attempts by SoC/processor 550 to the contents of virtual memory bank 635 during a certain time interval. If the counter shows that the number of access attempts by SoC/processor 550 is less than a pre-determined threshold value, then interface controller 530 may store the contents of virtual memory bank 635 that has been modified in non-volatile memory 525. Interface controller 530 may discard the contents of virtual memory bank 635 after determining that the contents has not been modified. On the other hand, if the counter shows that the number of access attempts by SoC/processor 550 is equal to or larger than a pre-determined threshold value, then interface controller 530 may store data in buffer 540. In addition, the counter may be configured to set up a by-pass indicator when the number of access attempts by SoC/processor 550 is less than a pre-determined threshold value in order to by-pass saving the contents of virtual memory bank 635 to buffer 540. The by-pass indicator then may be used to directly save the modified contents of virtual memory bank 635 to non-volatile memory 525. One skilled in the art should be able to devise various criteria (e.g., criteria including a value of a counter, a clock, time period, etc.) for the interface controller in light of other aspects of non-volatile memory system or sub-system operation (e.g., cache memory operation of SoC/processor, buffer capacity, etc.) in order to satisfy overall requirements.

Operation of interface controller 530 managing data may prevent harm to non-volatile memory 525, e.g., FeRAM arrays, by restricting actual read or write cycles to FeRAM arrays. For instance, interface controller 530 may produce data to SoC/processor 550 without actually accessing non-volatile memory 525 when the data are available in either virtual memory bank 635 or buffer 540. In addition, interface controller 530 may avoid storing data to non-volatile memory 525 when it is appropriate to store data in buffer 540 or to discard data. Such management of data by interface controller 530 may be beneficial from FeRAM reliability aspects because FeRAM cells may have a limited endurance compared to DRAM cells; that is, an FeRAM cell may have a limited number of read or write cycles that it can support over its lifetime, whereas DRAM cell may have an unlimited or effectively unlimited endurance. In some cases, the endurance of a FeRAM array may be insufficient for some deployments or uses where a small fraction of the FeRAM cells are subjected to their endurance limit. For example, FeRAM cell may have an endurance limit appropriate for many typical electronic applications; however, a malicious attack (e.g., due to a computer virus or unauthorized access) may attempt to destroy the FeRAM by continuously reading or writing a small fraction of FeRAM cells until they reach their endurance limit. Thus, interface controller 530 managing data may be able to mitigate risks involved in FeRAM cell operation by either avoiding such malicious attack or by effectively managing wear levels associated with non-volatile memory 525.

Figure 7:
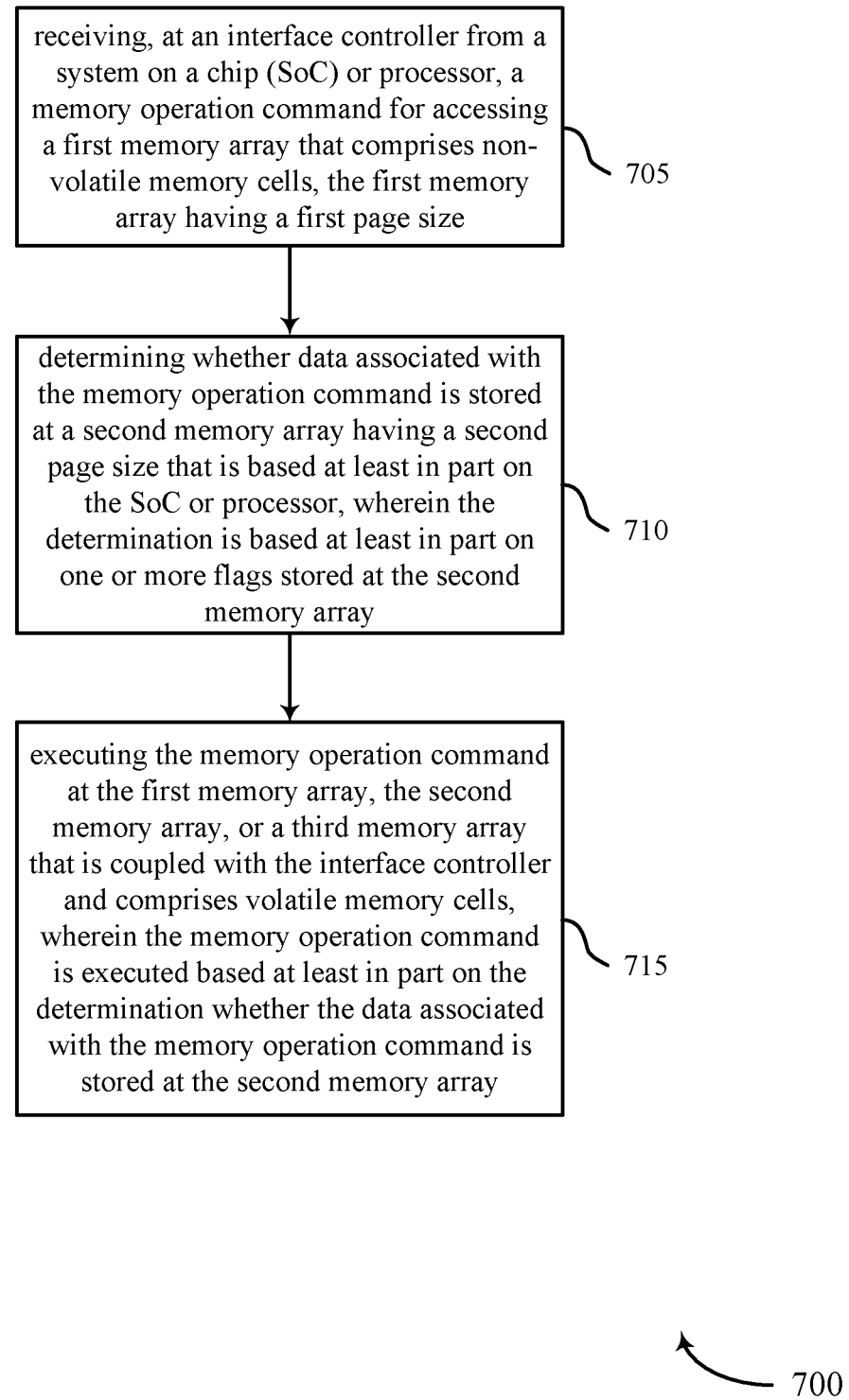
FIG. 7 shows a flowchart illustrating a method for operating a non-volatile memory system or sub-system in accordance with embodiments of the present disclosure.

FIG. 7 shows a flowchart illustrating a method 700 for operating a non-volatile memory system or sub-system in accordance with embodiments of the present disclosure. The operation of method 700 may be implemented by interface controller 120 as described with reference to FIG. 1 or interface controller 530 as described with reference to FIG. 5, as described herein.

At block 705, interface controller 530 may receive, from a system on a chip (SoC) or processor, a memory operation command for accessing a first memory array that includes non-volatile memory cells, the first memory array having a first page size. The operations of block 705 may be performed according to the methods described with reference to FIGS. 1 through 6.

At block 710, interface controller 530 may determine whether data associated with the memory operation command is stored at a second memory array having a second page size that is based at least in part on the SoC or processor, where the determination is based at least in part on one or more flags stored at the second memory array. The operations of block 710 may be performed according to the methods described with reference to FIGS. 1 through 6.

At block 715, interface controller 530 may execute the memory operation command at the first memory array, the second memory array, or a third memory array that is coupled with the interface controller and includes volatile memory cells, where the memory operation command is executed based at least in part on the determination whether the data associated with the memory operation command is stored at the second memory array. The operations of block 715 may be performed according to the methods described with reference to FIGS. 1 through 6.

In some embodiments, a method for non-volatile memory system or sub-system is disclosed. The method may include receiving, at an interface controller from a system on a chip (SoC) or processor, a memory operation command for accessing a first memory array that includes non-volatile memory cells, the first memory array having a first page size; determining whether data associated with the memory operation command is stored at a second memory array having a second page size that is based at least in part on the SoC or processor, where the determination is based at least in part on one or more flags stored at the second memory array; and executing the memory operation command at the first memory array, the second memory array, or a third memory array that is coupled with the interface controller and includes volatile memory cells, where the memory operation command is executed based at least in part on the determination whether the data associated with the memory operation command is stored at the second memory array.

In some cases, the second memory array, the third memory array, and the interface controller are disposed on a same chip. In some cases, the second page size is a superset of the first page size that is configurable. In some cases, determining whether data associated with the memory operation command is stored at a second memory array includes detecting one or more first flags that each indicate a portion of the second memory array storing valid data from the first memory array, or detecting one or more second flags that each indicate a portion of the second memory array storing data that is different from the first memory array, or detecting one or more of the first flags and one or more of the second flags.

In some cases, the memory operation command includes a read command. In some cases, the method may further include determining that data associated with the memory operation command is stored at the third memory array, where the third memory array is configured at least in part with the second page size; where executing the memory operation command includes fetching data from the third memory array based at least in part on determining that data associated with the memory operation command is stored at the third memory array, and sending data to the SoC or processor based at least in part on fetching the data. In some cases, the method may further include determining that data associated with the memory operation command is stored at the third memory array, where the third memory array is configured at least in part with the second page size, and accessing the third memory array directly from the SoC or processor. In some cases, executing the memory operation command includes fetching data from the second memory array based at least in part on determining that data associated with the memory operation command is stored at the second memory array; and sending the data to the SoC or processor based at least in part on fetching the data. In some cases, executing the memory operation command includes fetching data from the first memory array based at least in part on determining whether data associated with the memory operation command is stored at the second memory array, storing data in one or more portions of the second memory array, updating the one or more first flags indicating valid data stored in the one or more portions of the second memory array, and sending the data to the SoC or processor based at least in part on fetching the data.

In some cases, the memory operation command includes a write command. In some cases, executing the memory operation command includes storing data in one or more portions of the second memory array, and updating the one or more second flags indicating portions of the second memory array storing data that is different from the first memory array. In some cases, the memory operation command from the SoC or processor includes a command to write data from the second memory array to either the first memory array or to the third memory array based at least in part on a number of access attempts by the SoC or processor during a time interval. In some cases, executing the memory operation command includes storing data at the first memory array based at least in part on the number of access attempts being less than a threshold value. In some cases, the threshold value includes at least one of a temporal value, a value of a counter, a clock, or any combination thereof. In some cases, executing the memory operation command includes storing data at the third memory array based at least in part on the number of access attempts being equal to or greater than a threshold value. In some cases, the threshold value includes at least one of a temporal value, a value of a counter, a clock, or any combination thereof.

It should be noted that the methods described above describe possible implementations, and that the operations and the steps may be rearranged or otherwise modified and that other implementations are possible. Furthermore, features from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
receiving, at an interface controller from a system on a chip (SoC) or processor, a memory operation command for accessing a first memory array that comprises non-volatile memory cells, the first memory array having a first page size;
determining whether data associated with the memory operation command is stored at a second memory array having a second page size that is based at least in part on the SoC or processor, wherein the determination is based at least in part on one or more flags stored at the second memory array, wherein the second page size is different than the first page size; and
executing the memory operation command at the first memory array, the second memory array, or a third memory array that is coupled with the interface controller and comprises volatile memory cells, wherein the memory operation command is executed based at least in part on the determination whether the data associated with the memory operation command is stored at the second memory array.

2. The method of claim 1, wherein determining whether data associated with the memory operation command is stored at the second memory array comprises:
detecting one or more first flags that each indicate a portion of the second memory array storing valid data from the first memory array; or
detecting one or more second flags that each indicate a portion of the second memory array storing data that is different from the first memory array; or
detecting one or more of the first flags and one or more of the second flags.

3. The method of claim 2, wherein the memory operation command comprises a read command.

4. The method of claim 3, further comprising:
determining that data associated with the memory operation command is stored at the third memory array, wherein the third memory array is configured at least in part with the second page size;
wherein executing the memory operation command comprises:
fetching data from the third memory array based at least in part on determining that data associated with the memory operation command is stored at the third memory array; and
sending data to the SoC or processor based at least in part on fetching the data.

5. The method of claim 3, further comprising:
determining that data associated with the memory operation command is stored at the third memory array, wherein the third memory array is configured at least in part with the second page size; and
accessing the third memory array directly from the SoC or processor.

6. The method of claim 3, wherein executing the memory operation command comprises:
fetching data from the second memory array based at least in part on determining that data associated with the memory operation command is stored at the second memory array; and
sending the data to the SoC or processor based at least in part on fetching the data.

7. The method of claim 3, wherein executing the memory operation command comprises:
fetching data from the first memory array based at least in part on determining whether data associated with the memory operation command is stored at the second memory array;
storing data in one or more portions of the second memory array;
updating the one or more first flags indicating valid data stored in the one or more portions of the second memory array; and
sending the data to the SoC or processor based at least in part on fetching the data.

8. The method of claim 2, wherein the memory operation command comprises a write command.

9. The method of claim 8, wherein executing the memory operation command comprises:
storing data in one or more portions of the second memory array; and
updating the one or more second flags indicating portions of the second memory array storing data that is different from the first memory array.

10. The method of claim 1, wherein the memory operation command from the SoC or processor comprises a command to write data from the second memory array to either the first memory array or to the third memory array based at least in part on a number of access attempts by the SoC or processor during a time interval.

11. The method of claim 10, wherein executing the memory operation command comprises:
storing data at the first memory array based at least in part on the number of access attempts being less than a threshold value.

12. The method of claim 11, wherein the threshold value comprises at least one of a temporal value, a value of a counter, a clock, or any combination thereof.

13. The method of claim 10, wherein executing the memory operation command comprises:
storing data at the third memory array based at least in part on the number of access attempts being equal to or greater than a threshold value.

14. An apparatus, comprising:
means for receiving, at an interface controller from a system on a chip (SoC) or processor, a memory operation command for accessing a first memory array that comprises non-volatile memory cells, the first memory array having a first page size;
means for determining whether data associated with the memory operation command is stored at a second memory array having a second page size that is based at least in part on the SoC or processor, wherein the determination is based at least in part on one or more flags stored at the second memory array, wherein the second page size is different than the first page size; and
means for executing the memory operation command at the first memory array, the second memory array, or a third memory array that is coupled with the interface controller and comprises volatile memory cells, wherein the memory operation command is executed based at least in part on the determination whether the data associated with the memory operation command is stored at the second memory array.

15. The apparatus of claim 14, further comprising:
means for detecting one or more first flags that each indicate a portion of the second memory array storing valid data from the first memory array; or
means for detecting one or more second flags that each indicate a portion of the second memory array storing data that is different from the first memory array; or means for detecting one or more of the first flags and one or more of the second flags.

16. The apparatus of claim 14, further comprising:

means for determining that data associated with the memory operation command is stored at the third memory array, wherein the third memory array is configured at least in part with the second page size;

wherein the means for executing the memory operation command comprises:

means for fetching data from the third memory array based at least in part on determining that data associated with the memory operation command is stored at the third memory array; and means for sending data to the SoC or processor based at least in part on fetching the data.

17. The apparatus of claim 14, further comprising:

means for determining that data associated with the memory operation command is stored at the third memory array, wherein the third memory array is configured at least in part with the second page size; and means for accessing the third memory array directly from the SoC or processor.

18. The apparatus of claim 14, further comprising:

means for fetching data from the second memory array based at least in part on determining that data associated with the memory operation command is stored at the second memory array; and means for sending the data to the SoC or processor based at least in part on fetching the data.

19. The apparatus of claim 15, further comprising:

means for fetching data from the first memory array based at least in part on determining whether data associated with the memory operation command is stored at the second memory array;

means for storing data in one or more portions of the second memory array;

means for updating the one or more first flags indicating valid data stored in the one or more portions of the second memory array; and means for sending the data to the SoC or processor based at least in part on fetching the data.

20. An apparatus, comprising:

a first memory array that comprises non-volatile memory cells and has a first page size;

a second memory array that is configured to store data based at least in part on a second page size associated with a system on chip (SoC) or processor; and a controller configured to interface with the SoC or processor, the first memory array and the second memory array wherein the controller is operable to:

receive, from the SoC or processor, a memory operation command for accessing the first memory array;

determine whether data associated with the memory operation command is stored at the second memory array, wherein the determination is based at least in part on one or more flags stored at the second memory array, wherein the second page size is different than the first page size; and execute the memory operation command at the first memory array or the second memory array based at least in part on the determination whether the data associated with the memory operation command is stored at the second memory array.

\* \* \* \* \*